US011181939B2

(12) United States Patent
Iguchi et al.

(10) Patent No.: US 11,181,939 B2
(45) Date of Patent: Nov. 23, 2021

(54) MULTI-MODE OSCILLATION CIRCUITRY WITH STEPPING CONTROL

(71) Applicant: Qualcomm Incorporated, San Diego, CA (US)

(72) Inventors: Shunta Iguchi, San Diego, CA (US); Ilker Deligoz, Chandler, AZ (US); Michael Naone Farias, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 239 days.

(21) Appl. No.: 16/420,723

(22) Filed: May 23, 2019

(65) Prior Publication Data

US 2020/0371545 A1 Nov. 26, 2020

(51) Int. Cl.
*H03L 5/02* (2006.01)
*H03B 5/36* (2006.01)
(Continued)

(52) U.S. Cl.
CPC ................. *G06F 1/08* (2013.01); *H03B 5/02* (2013.01); *H03B 5/1271* (2013.01); *H03B 5/364* (2013.01);
(Continued)

(58) Field of Classification Search
CPC .. H03B 5/1225; H03B 5/1234; H03B 5/1271; H03B 5/30; H03B 5/32; H03B 5/36; H03B 5/364; H03B 5/366; H03B 2200/0046; H03B 2200/0082; H03B 2200/009; H03L 5/00; H03L 5/02
See application file for complete search history.

(56) References Cited

U.S. PATENT DOCUMENTS 5,208,558 A * 5/1993 Shigehara ............ H03K 3/0307
331/116 FE
5,557,243 A * 9/1996 Ho ......................... H03K 3/014
331/116 FE
(Continued)

OTHER PUBLICATIONS

International Search Report and Written Opinion—PCT/US2020/034091—ISA/EPO—dated Aug. 18, 2020.
(Continued)

*Primary Examiner* — Levi Gannon
(74) *Attorney, Agent, or Firm* — Qualcomm Incorporated

(57) ABSTRACT

An apparatus is disclosed for implementing multi-mode oscillation circuitry with stepping control. In an example aspect, the multi-mode oscillation circuitry comprises a resonator coupled to a first oscillator and a second oscillator. The multi-mode oscillation circuitry is configured to selectively be in a first configuration with the first oscillator in an active state and the second oscillator in an inactive state or a second configuration with the first oscillator in the inactive state and the second oscillator in the active state. The apparatus also includes a step-control circuit coupled to the multi-mode oscillation circuitry. The step-control circuit is configured to cause the first oscillator to switch from the inactive state to the active state and incrementally increase a first gain of the first oscillator based on the first oscillator being in the active state to enable the multi-mode oscillation circuitry to transition from the second configuration to the first configuration.

30 Claims, 8 Drawing Sheets

(51) Int. Cl.
*G06F 1/08* (2006.01)
*H03B 5/02* (2006.01)
*H03B 5/12* (2006.01)

(52) U.S. Cl.
CPC .......... *H03L 5/02* (2013.01); *H03B 2200/009* (2013.01); *H03B 2200/0046* (2013.01); *H03B 2200/0082* (2013.01)

(56) References Cited

U.S. PATENT DOCUMENTS

| | | | | | |
|---|---|---|---|---|---|
| 6,133,801 | A * | 10/2000 | Tanaka | H03B 5/32 | 331/158 |
| 7,042,298 | B2 * | 5/2006 | Nakahi | H03K 3/014 | 331/158 |
| 7,848,709 | B2 | 12/2010 | Kappes | | |
| 2004/0169562 | A1 * | 9/2004 | Novac | H03B 5/06 | 331/158 |
| 2005/0151596 | A1 * | 7/2005 | Lin | H03B 5/06 | 331/158 |
| 2008/0136541 | A1 * | 6/2008 | Yoshinaga | H03B 5/06 | 331/116 FE |
| 2009/0289732 | A1 | 11/2009 | Miyashita | | |
| 2010/0066458 | A1 * | 3/2010 | Liu | H03L 5/00 | 331/160 |
| 2014/0070897 | A1 | 3/2014 | Brekelmans et al. | | |
| 2015/0180414 | A1 | 6/2015 | Lee et al. | | |
| 2016/0191061 | A1 * | 6/2016 | Aremallapur | H03L 7/00 | 331/18 |
| 2019/0007012 | A1 * | 1/2019 | Marques | H03F 3/45179 | |
| 2019/0074840 | A1 | 3/2019 | Ciubotaru | | |

OTHER PUBLICATIONS

Hsiao, "A 1.89nW/0.15V Self-Charged XO for Real-Time Clock Generation", ISSCC 2014 / Session 17 / Analog Techniques /17.7, 2014, 3 pages.

* cited by examiner

700

```
┌─────────────────────────────────────────────┐
│ Generate a clock signal using a resonator of│
│ multi-mode oscillation circuitry, the multi-mode│
│ oscillation circuitry comprising a first oscillator and│
│ a second oscillator that are coupled to the resonator│
│                    702                      │
└─────────────────────────────────────────────┘
                       │
                       ▼
┌─────────────────────────────────────────────┐
│ Operate the multi-mode oscillation circuitry in a first│
│ configuration comprising the first oscillator being in an│
│ active state and the second oscillator being in an inactive│
│ state to enable the resonator to generate the clock signal│
│                    704                      │
└─────────────────────────────────────────────┘
                       │
                       ▼
┌─────────────────────────────────────────────┐
│ Operating the multi-mode oscillation circuitry in a second│
│ configuration comprising the first oscillator being in the│
│ inactive state and the second oscillator being in the active│
│ state to enable the resonator to generate the clock signal│
│                    706                      │
└─────────────────────────────────────────────┘
                       │
                       ▼
┌─────────────────────────────────────────────┐
│ Transition from the operating of the multi-mode oscillation│
│ circuitry in the second configuration to the operating of│
│ the multi-mode oscillation circuitry in the first configuration│
│ by incrementally increasing a first gain of the first│
│ oscillator while the second oscillator is in the active state│
│                    708                      │
└─────────────────────────────────────────────┘
```

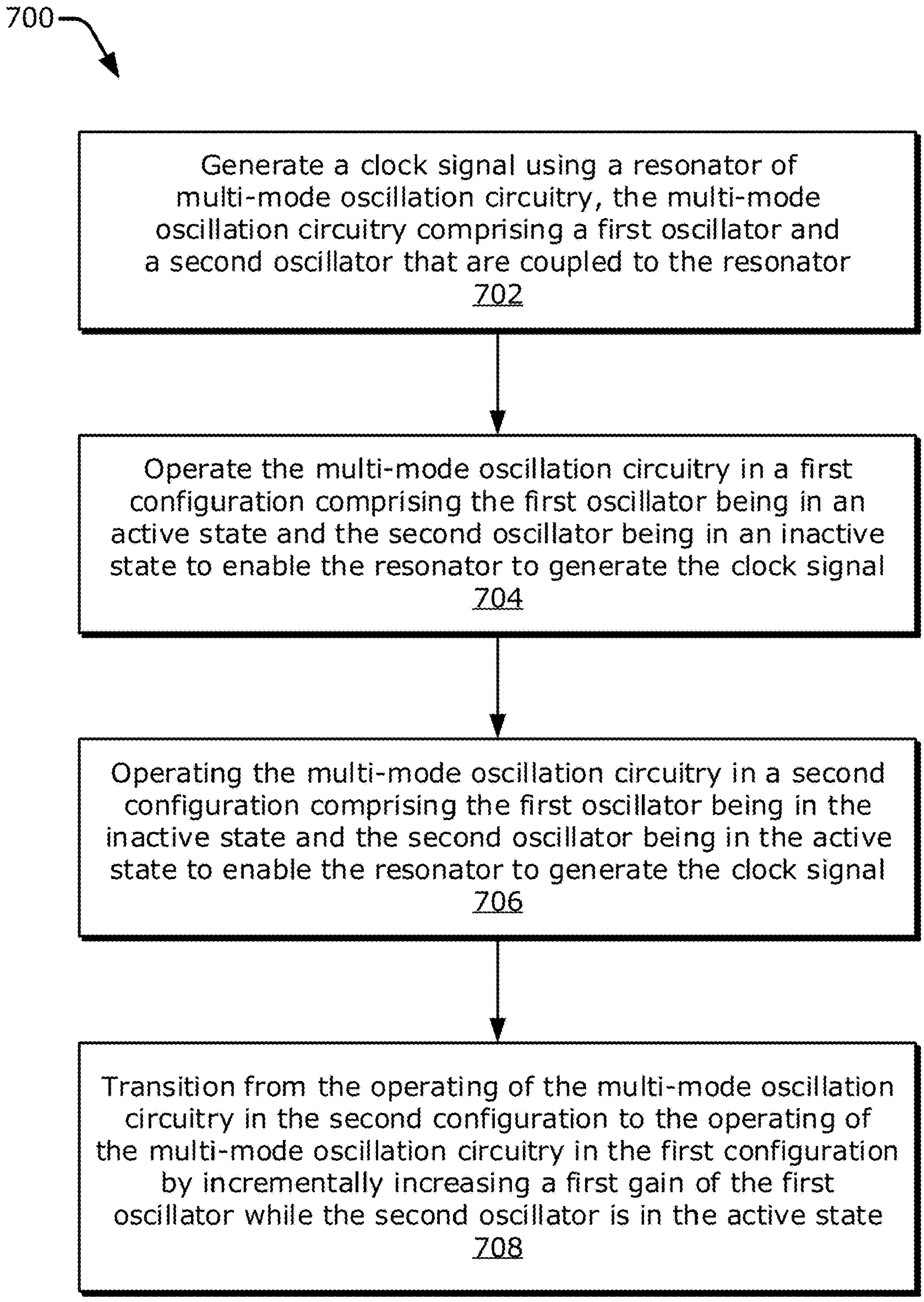

FIG. 7

MULTI-MODE OSCILLATION CIRCUITRY WITH STEPPING CONTROL

TECHNICAL FIELD

This disclosure relates generally to clock generation and, more specifically, to multi-mode oscillation circuitry with stepping controls for smoothly transitioning between different configurations that utilize different oscillators.

BACKGROUND

Electronic devices use radio-frequency (RF) signals to communicate information. These radio-frequency signals enable users to talk with friends, download information, share pictures, remotely control household devices, receive global positioning information, employ radar for detection and tracking, or listen to radio stations. To generate these radio-frequency signals, an electronic device may include a clock generator, which generates a clock signal. The clock signal provides a stable frequency reference, which can be used to perform wireless communication. The clock signal may be provided, for example, to a mixer for frequency conversion (e.g., up-converting or down-converting communication signals) or a phase-locked loop for generating another signal having a different stable frequency reference.

Due to a reliance upon the clock signal, any frequency errors or noise in the clock signal can directly impact communication quality and performance. In some cases, operations performed using the clock signal may further increase a magnitude of the frequency errors or noise of the clock signal. As such, it is important that noise in the clock signal be within some predetermined threshold. One particular type of noise is phase noise, which represents random fluctuations in a phase of the clock signal. High levels of phase noise can increase an overall noise floor of a receiver, which decreases a sensitivity or a dynamic range of an electronic device. This makes it more challenging for the electronic device to detect weaker signals or signals that originate at farther distances.

Phase-noise performance of a clock generator can depend upon many factors, including power consumption and types of components. Better phase-noise performance is typically realized with higher power consumption or through utilizing larger size components. The former is expensive in terms of battery usage, and the latter is expensive in terms of device cost. Furthermore, different communication standards may be associated with different phase-noise thresholds. If an electronic device supports multiple communication standards (e.g., cellular, global positioning system (GPS), Wi-Fi™, or Bluetooth™), a design of the clock generator may have to support more than one phase-noise threshold. Overall, it becomes challenging to design a clock generator that supports multiple communication standards, conserves power, and physically fits within a designated space.

SUMMARY

An apparatus is disclosed that implements multi-mode oscillation circuitry with stepping control. A clock generator generates a clock signal using the multi-mode oscillation circuitry, which includes two or more oscillators individually coupled to a resonator. In a first configuration, the multi-mode oscillation circuitry operates with a first oscillator in an active state and a second oscillator in an inactive state. In a second configuration, the multi-mode oscillation circuitry operates with the first oscillator in the inactive state and the second oscillator in the active state.

In some situations, the oscillators are designed to have different performance characteristics. The first oscillator can, for instance, generate a lower amount of phase noise relative to the second oscillator. However, the second oscillator can consume less power relative to the first oscillator. As such, a configuration of the multi-mode oscillation circuitry can be appropriately selected based on an operational mode of the wireless transceiver. However, abrupt switching between two or more configurations can adversely impact a clock signal generated using the multi-mode oscillation circuitry.

Instead of abruptly switching between the different configurations as the operational modes of the wireless transceiver change, a step-control circuit enables the multi-mode oscillation circuitry to smoothly transition between the different configurations. As described herein, the step-control circuit incrementally adjusts respective gains of the oscillators so as to continuously provide the clock signal while mitigating glitching or other disturbances to the clock signal. This enables the clock signal to be used reliably by sensitive systems, such as digital systems operating to provide wireless communications. In these manners, a single resonator can be used with multiple oscillators to provide multiple clock signals having different characteristics with lower costs and occupying a smaller area.

In an example aspect, an apparatus is disclosed. The apparatus includes multi-mode oscillation circuitry configured to selectively be in a first configuration or a second configuration. The multi-mode oscillation circuitry comprises a resonator, a first oscillator coupled to the resonator, and a second oscillator coupled to the resonator. The first oscillator is configured to selectively be in an active state based on the first configuration and an inactive state based on the second configuration. The second oscillator is configured to selectively be in the inactive state based on the first configuration and the active state based on the second configuration. The apparatus also includes a step-control circuit coupled to the multi-mode oscillation circuitry. The step-control circuit configured to cause the first oscillator to switch from the inactive state to the active state. The step-control circuit is also configured to incrementally increase a first gain of the first oscillator based on the first oscillator being in the active state to enable the multi-mode oscillation circuitry to transition from the second configuration to the first configuration.

In an example aspect, an apparatus is disclosed. The apparatus includes multi-mode oscillation circuitry configured to selectively be in a first configuration or a second configuration. The multi-mode oscillation circuitry comprises a resonator, a first oscillator coupled to the resonator, and a second oscillator coupled to the resonator. The first oscillator is configured to selectively be in an active state based on the first configuration and an inactive state based on the second configuration. The second oscillator is configured to selectively be in the inactive state based on the first configuration and the active state based on the second configuration. The apparatus also includes stepping means for causing the first oscillator to switch from the inactive state to the active state and incrementally increasing a first gain of the first oscillator to enable the multi-mode oscillation circuitry to transition from the second configuration to the first configuration.

In an example aspect, a method for operating multi-mode oscillation circuitry with stepping control is disclosed. The method comprises generating a clock signal using a resonator of the multi-mode oscillation circuitry. The multi-mode oscillation circuitry comprises a first oscillator and a second oscillator that are coupled to the resonator. The method also comprises operating the multi-mode oscillation circuitry in a first configuration that comprises the first oscillator being in an active state and the second oscillator being in an inactive state to enable the resonator to generate the clock signal. The method further comprises operating the multi-mode oscillation circuitry in a second configuration that comprises the first oscillator being in the inactive state and the second oscillator being in the active state to enable the resonator to generate the clock signal. Additionally, the method comprises transitioning from the operating of the multi-mode oscillation circuitry in the second configuration to the operating of the multi-mode oscillation circuitry in the first configuration by incrementally increasing a first gain of the first oscillator while the second oscillator is in the active state.

In an example aspect, an apparatus is disclosed. The apparatus comprises a clock generator, which comprises multi-mode oscillation circuitry and a step-control circuit. The multi-mode oscillation circuitry comprises a resonator, a first oscillator coupled to the resonator, and a second oscillator coupled to the resonator. The first oscillator are the second oscillator are individually configured to selectively be in an active state or an inactive state. The step-control circuit comprises a first step driver coupled to the first oscillator and configured to incrementally adjust a first gain of the first oscillator while the second oscillator is in the active state. The step-control circuit also comprises a second step driver coupled to the second oscillator and configured to incrementally adjust a second gain of the second oscillator while the first oscillator is in the active state

BRIEF DESCRIPTION OF DRAWINGS

FIG. 4-1 illustrates example signals for operating multi-mode oscillation circuitry with stepping control.

FIG. 4-2 illustrates other example signals for operating multi-mode oscillation circuitry with stepping control.

FIG. 7 is a flow diagram illustrating an example process for operating multi-mode oscillation circuitry with stepping control.

DETAILED DESCRIPTION

Figure 1:
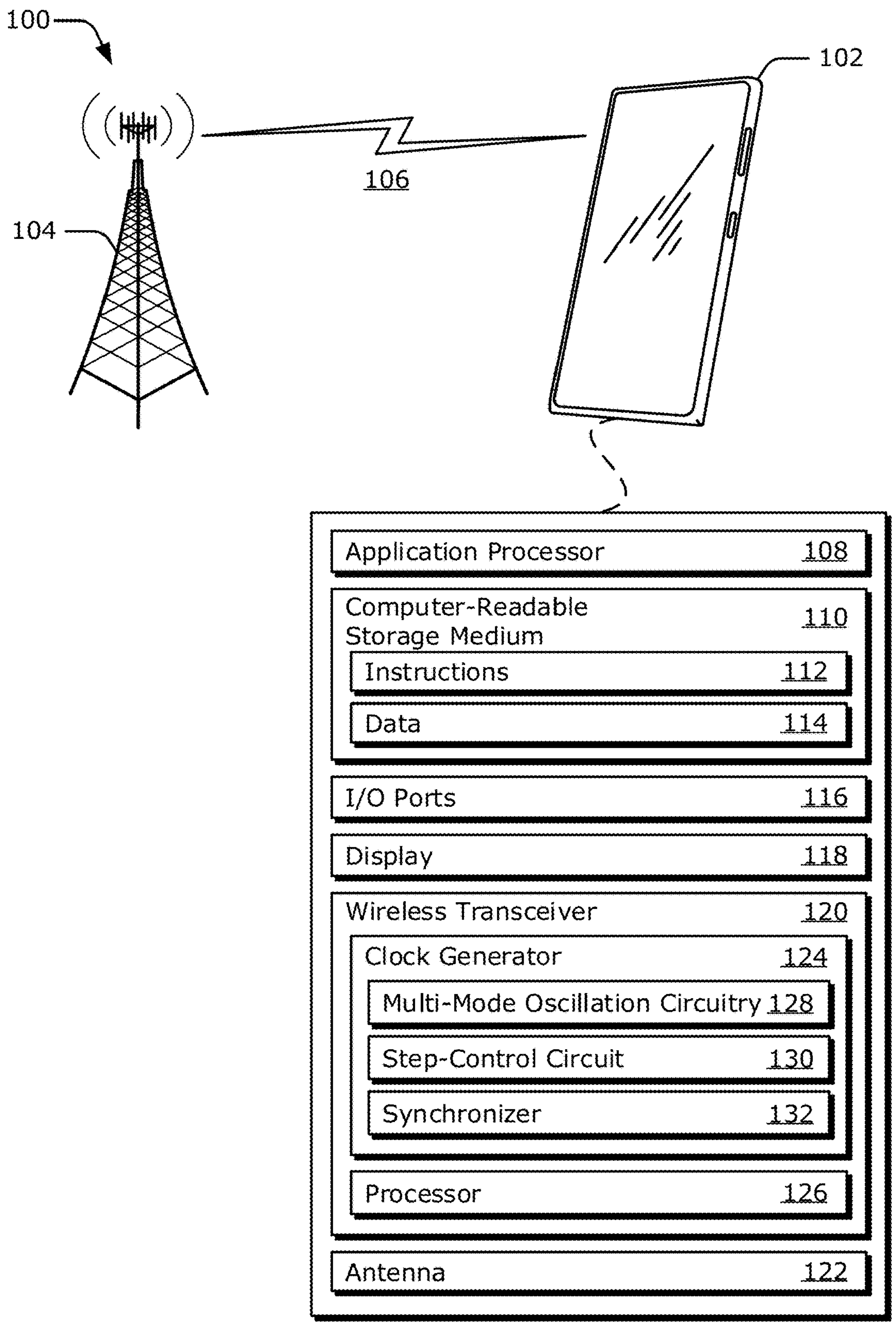
FIG. 1 illustrates an example operating environment for implementing multi-mode oscillation circuitry with stepping control.

Electronic devices use clock generators to support radio-frequency communications. A clock generator generates a reference clock signal having a predetermined frequency. This clock signal can be referenced by other components in the electronic device, including mixers, signal generators, phase-locked loops (PLLs), delay-locked loops (DLLs), and so forth. Due to a reliance on the clock signal, any frequency errors or phase noise in the clock signal can propagate to downstream circuit components, thereby impacting processing or communication quality and performance. Additionally, different communication standards may be associated with different phase-noise thresholds. If the electronic device supports multiple communication standards (e.g., cellular, global positioning system (GPS), Wi-Fi™, or Bluetooth™), a design of the clock generator may have to support more than one phase-noise threshold.

To support different communication standards, some techniques utilize different oscillation circuitry, which use different resonators. Performance of each oscillation circuitry can be tuned for a corresponding communication standards. However, implementing multiple oscillation circuitries adds additional complexity to the electronic device and increases costs. Furthermore, the multiple oscillation circuitries occupy additional space in the electronic device and involve additional wire routing.

In contrast, example approaches are described herein for multi-mode oscillation circuitry with stepping control. A clock generator generates a clock signal using the multi-mode oscillation circuitry, which includes two or more oscillators individually coupled to a resonator. In a first configuration, the multi-mode oscillation circuitry operates with a first oscillator in an active state and a second oscillator in an inactive state. In a second configuration, the multi-mode oscillation circuitry operates with the first oscillator in the inactive state and the second oscillator in the active state.

In some situations, the oscillators are designed to have different performance characteristics. The first oscillator can, for instance, generate a lower amount of phase noise relative to the second oscillator. However, the second oscillator can consume less power relative to the first oscillator. As such, a configuration of the multi-mode oscillation circuitry can be appropriately selected based on an operational mode of the wireless transceiver. However, abrupt switching between two or more configurations can adversely impact a clock signal generated using the multi-mode oscillation circuitry.

Instead of abruptly switching between the different configurations as the operational modes of the wireless transceiver change, a step-control circuit enables the multi-mode oscillation circuitry to smoothly transition between the different configurations. As described herein, the step-control circuit incrementally adjusts respective gains of the oscillators so as to continuously provide the clock signal while mitigating glitching or other disturbances to the clock signal. This enables the clock signal to be used reliably by sensitive systems, such as digital systems operating to provide wireless communications. In these manners, a single resonator can be used with multiple oscillators to provide multiple clock signals having different characteristics with lower costs and occupying a smaller area.

FIG. 1 illustrates an example environment 100 for implementing multi-mode oscillation circuitry with stepping control. In the environment 100, a computing device 102 communicates with a base station 104 through a wireless communication link 106 (wireless link 106). In this example, the computing device 102 is depicted as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, wearable computer, server, network-attached storage (NAS) device, smart appliance or other internet of things (IoT) device, medical device, vehicle-based communication system, radar, radio apparatus, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, server device, terrestrial television broadcast tower, access point, peer-to-peer device, mesh network node, fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102, or an uplink of other data or control information communicated from the computing device 102 to the base station 104. The wireless link 106 may be implemented using any suitable communication protocol or standard, such as second-generation (2G), third-generation (3G), fourth-generation (4G), or fifth-generation (5G) cellular; IEEE 802.11 (e.g., Wi-Fi™); IEEE 802.15 (e.g., Bluetooth™); IEEE 802.16 (e.g., WiMAX™); and so forth. In some implementations, the wireless link 106 may wirelessly provide power and the base station 104 may comprise a power source.

As shown, the computing device 102 includes an application processor 108 and a computer-readable storage medium 110 (CRM 110). The application processor 108 may include any type of processor, such as a multi-core processor, that executes processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver 120 of the computing device 102 provides connectivity to respective networks and other electronic devices connected therewith. Alternately or additionally, the computing device 102 may include a wired transceiver, such as an Ethernet or fiber optic interface for communicating over a local network, intranet, or the Internet. The wireless transceiver 120 may facilitate communication over any suitable type of wireless network, such as a wireless local area network (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 122. Components of the wireless transceiver 120 can include mixers, phase-locked loops, delay-locked loops, amplifiers, switches, analog-to-digital converters, filters, and so forth for conditioning the communication signals (e.g., for generating or processing signals). The wireless transceiver 120 may also include logic to perform in-phase/quadrature (I/Q) operations, such as synthesis, encoding, modulation, decoding, demodulation, and so forth. In some cases, components of the wireless transceiver 120 are implemented as separate receiver and transmitter entities. Additionally or alternatively, the wireless transceiver 120 can be realized using multiple or different sections to implement respective receiving and transmitting operations (e.g., separate transmit and receive chains). In general, the wireless transceiver 120 processes data and/or signals associated with communicating data of the computing device 102 over the antenna 122.

As shown, the wireless transceiver 120 also includes at least one clock generator 124 and at least one processor 126. Alternatively, the clock generator 124 can be implemented separately from the wireless transceiver 120 and coupled thereto. In some implementations, the clock generator 124 and the processor 126 are implemented on separate integrated circuits. Generally speaking, the clock generator 124 uses a resonator to generate a clock signal without referencing another clock signal. This differs from other signal generating components, like PLLs, that use the clock signal from the clock generator to generate other versions of the clock signal that have different frequencies. In general, a clock signal that is generated by the clock generator 124 is a reference clock signal that is provided to other components of the wireless transceiver 120. The clock signal can additionally or alternatively be used for timing operations of synchronous logic. The clock generator 124 includes multi-mode oscillation circuitry 128, at least one step-control circuit 130, and at least one synchronizer 132, which are further described with respect to FIG. 2.

The processor 126, which can comprise a modem, can be implemented within or separate from the wireless transceiver 120. As an example, the processor 126 is implemented as a system-on-chip (SoC) that provides a digital communication interface for data, voice, messaging, and other applications of the computing device 102. The processor 126 can also include baseband circuitry to perform high-rate sampling processes that can include analog-to-digital conversion, digital-to-analog conversion, gain correction, skew correction, frequency translation, and so forth. Although not explicitly shown, the processor 126 can include a portion of the CRM 110 or can access the CRM 110 to obtain computer-readable instructions.

The processor 126 controls the wireless transceiver 120 and enables wireless communication to be performed. The processor 126 can provide communication data to the wireless transceiver 120 for transmission. The processor 126 can also process a baseband version of a signal accepted from the wireless transceiver 120 to generate data, which can be provided to other parts of the computing device 102 via a communication interface for wireless communication or proximity detection. In general, the processor 126 controls an operational mode of the wireless transceiver 120 or has knowledge of the operational mode. Different types of operational modes may include different transceiver modes (e.g., a transmit mode or a reception mode), different power modes (e.g., a low-power mode or a high-power mode), different resource control states (e.g., a connected mode, an inactive mode, or an idle mode), different communication modes (e.g., a 3G mode, a 4G mode, a 5G mode, a Wi-Fi™ mode, a GPS mode), different modulation modes (e.g., a lower-order modulation mode such as quadrature phase-shift keying (QPSK) modes or higher-order modulation modes such as 64 quadrature amplitude modulation (QAM) or 256 QAM), and so forth. The processor 126 varies a configuration of the multi-mode oscillation circuitry 128 based on the operational mode of the wireless transceiver 120, as further described with respect to FIG. 2.

Figure 2:
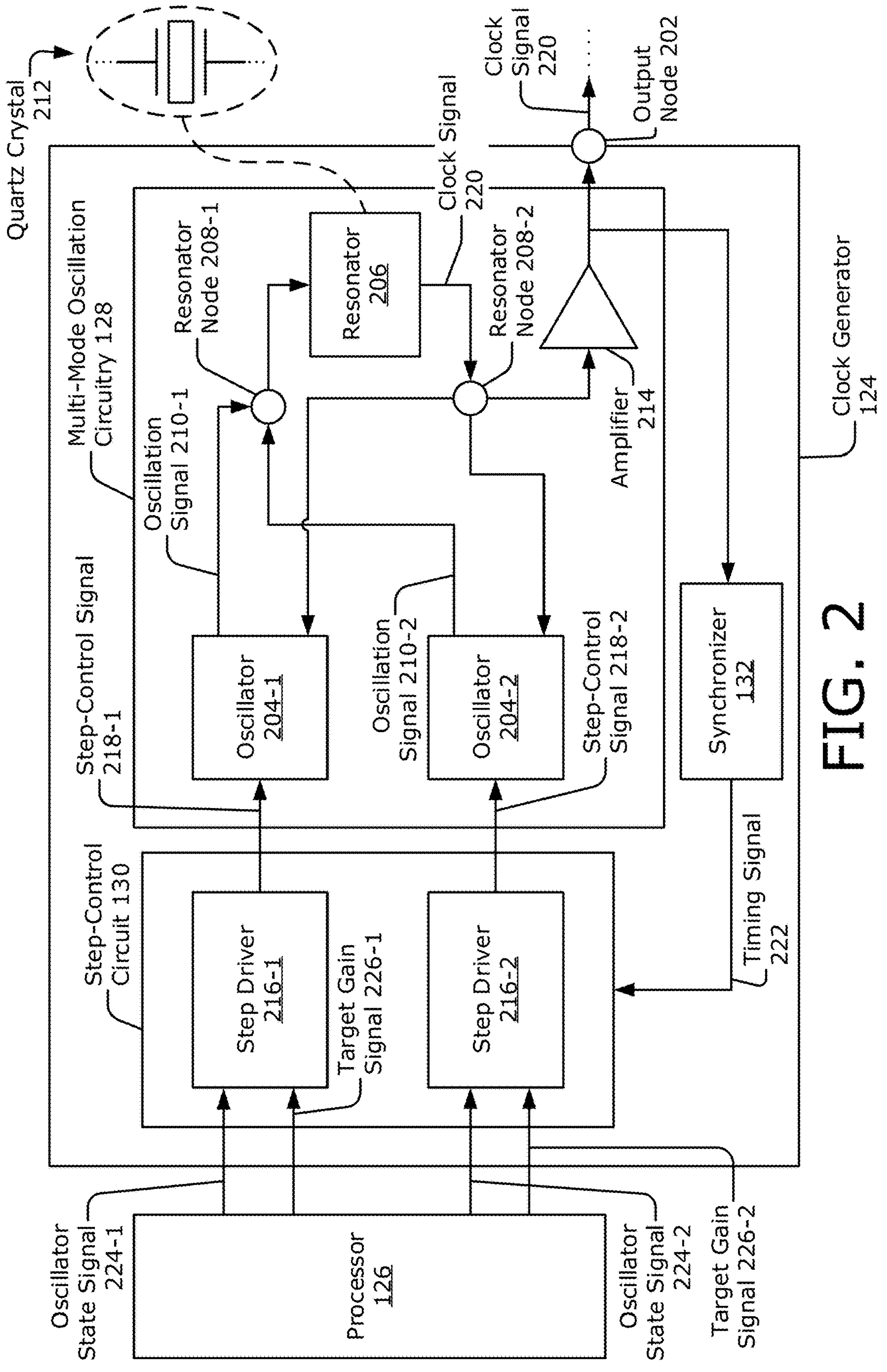
FIG. 2 illustrates an example implementation of a clock generator that implements multi-mode oscillation circuitry with stepping control.

FIG. 2 illustrates an example implementation of the clock generator 124 that implements the multi-mode oscillation circuitry 128 with stepping control. In the depicted configuration, the clock generator 124 includes the multi-mode oscillation circuitry 128, the step-control circuit 130, and the synchronizer 132. The clock generator 124 also includes an output node 202, which can be coupled to other circuit components within the wireless transceiver 120, such as a PLL or a mixer. The multi-mode oscillation circuitry 128 is coupled between the step-control circuit 130 and the output node 202. The synchronizer is coupled between the output node 202 and the step-control circuit 130.

The multi-mode oscillation circuitry 128 includes at least two oscillators 204-1 and 204-2, and at least one resonator 206 (e.g., as few as one resonator). In some implementations, the oscillators 204-1 and 204-2 are implemented on an integrated circuit and the resonator 206 is implemented on a printed circuit board (PCB). The resonator 206 is coupled between resonator nodes 208-1 and 208-2. In FIG. 2, the resonator node 208-2 is shown to be coupled to the output node 202. As such, the resonator node 208-1 represents an input node of the resonator 206, and the resonator node 208-2 represents an output node of the resonator 206. Each oscillator 204-1 and 204-2 is coupled to both the resonator node 208-1 and the resonator node 208-2.

In some implementations, designs of the oscillators 204-1 and 204-2 have different performance characteristics. As an example, the oscillator 204-1 can generate a lower amount of phase noise relative to the oscillator 204-2, but the oscillator 204-2 can consume less power relative to the oscillator 204-1. The oscillators 204-1 and 204-2 can be implemented as voltage-mode oscillators, current-mode oscillators, or a combination thereof. An example voltage-mode oscillator and an example current-mode oscillator are further described with respect to FIGS. 5 and 6, respectively. In general, the oscillators 204-1 and 204-2 include a power circuit and an amplification circuit.

The oscillators 204-1 and 204-2 can be independently configured to be in an active state or an inactive state. In the active state, the oscillator 204-1 or 204-2 consumes power and operates with a particular gain. Additionally, the oscillator 204-1 or 204-2 generates an oscillation signal 210 having a peak-to-peak voltage based on the gain. The oscillation signal 210 enables the resonator 206 to resonate. In FIG. 2, the oscillator 204-1 generates an oscillation signal 210-1, and the oscillator 204-2 generates an oscillation signal 210-2. While in the active state, a gain of the oscillator 204-1 or 204-2 can vary. Different gains can cause the oscillators 204-1 or 204-2 to consume different amounts of power or generate different amounts of phase noise.

In the inactive state, the oscillator 204-1 or 204-2 does not generate the oscillation signal 210 or generates the oscillation signal 210 with a peak-to-peak voltage that does not cause the resonator 206 to resonate. In general, the oscillation signal 210 has, based on the inactive state, a lower peak-to-peak voltage relative to any of the peak-to-peak voltages associated with the active state based on the gain.

The resonator 206 can include, for example, a quartz crystal, as shown by quartz crystal 212. In other implementations, the resonator 206 can include an inductor-capacitor (LC) resonator, a resonator transistor (e.g., a bipolar junction transistor (BJT), a junction gate field-effect transistor (JFET), a metal-oxide semiconductor field-effective transistor (MOSFET), or a gallium arsenide field-effect transistor (GaAsFET)), a transmission line, a diode, a piezoelectric oscillator, multiple quartz crystals 212, multiple resonators, and so forth. The resonator 206 resonates at a particular frequency.

The multi-mode oscillation circuitry 128 also includes an amplifier 214, which is coupled between the resonator node 208-2 and the output node 202. Although not shown, the multi-mode oscillation circuitry 128 can include other types of components, such as resistors and capacitors.

The step-control circuit 130 is coupled between the processor 126 and the multi-mode oscillation circuitry 128, and it includes at least two step drivers 216-1 and 216-2. The step drivers 216-1 and 216-2 are respectively coupled to the oscillators 204-1 and 204-2 and respectively generate step-control signals 218-1 and 218-2. The step-control signals 218-1 and 218-2 respectively control whether the oscillators 204-1 and 204-2 are in the active state or the inactive state. Additionally, the step-control signals 218-1 and 218-2 control respective gains of the oscillators 204-1 and 204-2 if the oscillators 204-1 and 204-2 are in the active state. The step drivers 216-1 and 216-2 can be implemented as a digital voltage generator, which generates control voltages or discrete voltages that are provided to components within the oscillators 204-1 and 204-2 via the step-control signals 218-1 and 218-2, respectively.

The synchronizer 132 provides feedback information to the step-control circuit 130 based on a clock signal 220, which the resonator 206 generates at the resonator node 208-2. In particular, the synchronizer 132 generates a timing signal 222, which includes a trigger to cause the step driver 216-1 to adjust the gain of the oscillators 204-1 or the step driver 216-2 to adjust the gain of the oscillator 204-2 at a particular time. In this manner, the synchronizer 132 can cause gains of the oscillators 204-1 and 204-2 to change during times at which the clock signal 220 is not near a zero-crossing. By changing the gain near peaks of the clock signal 220, glitching errors in the clock signal 220 can be avoided.

During operation, the processor 126 determines an operational mode of the wireless transceiver 120. Based on the operational mode, the processor 126 generates oscillator state signals 224-1 and 224-2, which respectively control whether the oscillators 204-1 and 204-2 are in the active state or the inactive state. The processor 126 also generates target gain signals 226-1 and 226-2, which specify target gains of the oscillation signals 210-1 and 210-2, respectively.

The step drivers 216-1 and 216-2 appropriately configure the oscillators 204-1 and 204-2 by generating the step-control signals 218-1 and 218-2 based on the oscillator state signals 224-1 and 224-2 and the target gain signals 226-1 and 226-2. Based on the step-control signals 218-1 and 218-2, the oscillators 204-1 and 204-2 respectively generate the oscillation signals 210-1 and 210-2. Due to the oscillation signals 210-1 and/or 210-2, the resonator 206 resonates and generates the clock signal 220, which is amplified by the amplifier 214. Using the oscillator state signals 224-1 and 224-2 and the target gain signals 226-1 to 226-2, the processor 126 can cause the multi-mode oscillation circuitry 128 to be in a particular configuration and switch between different configurations over time, as further described with respect to FIG. 3.

Figure 3:
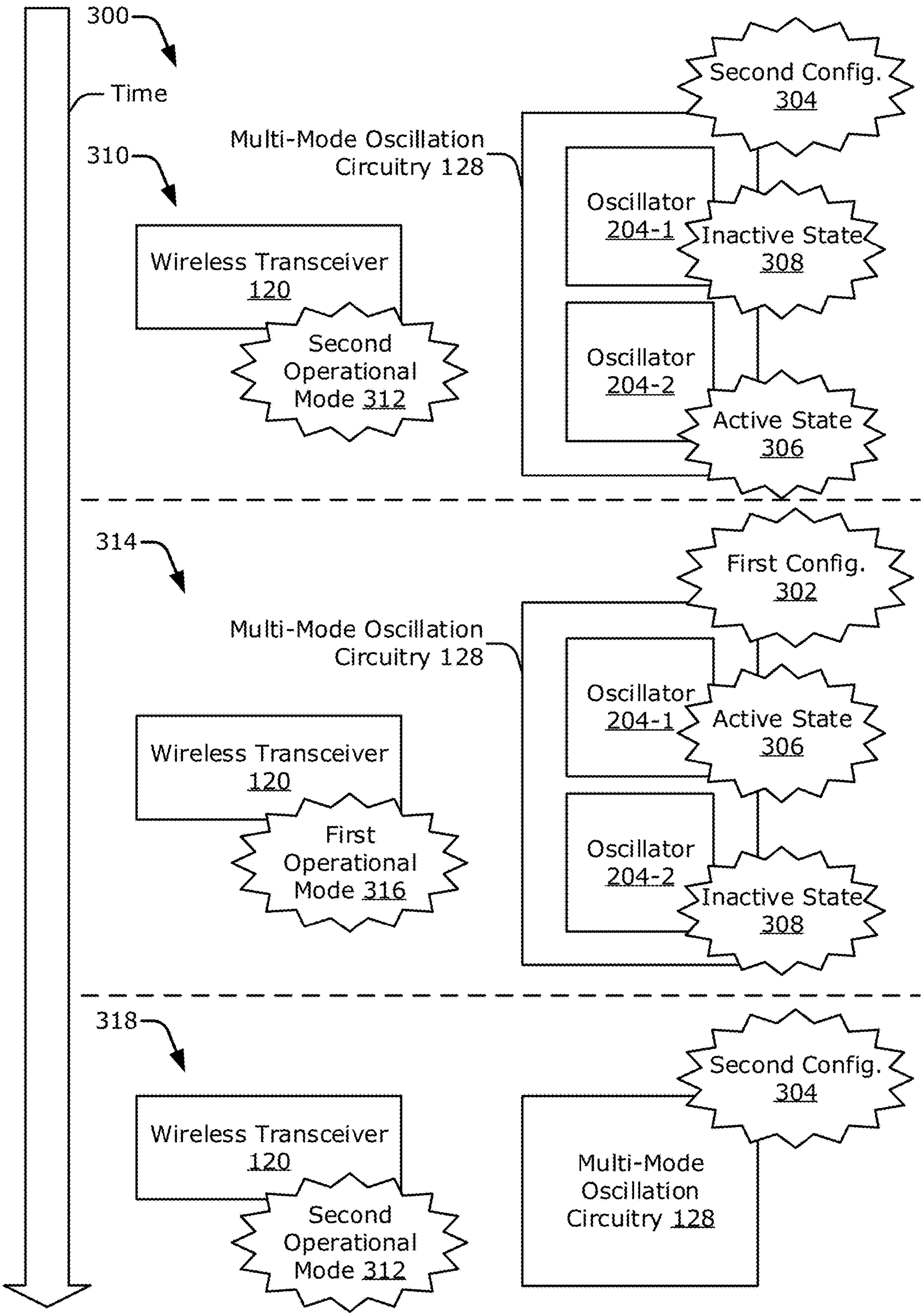
FIG. 3 illustrates an example sequence flow diagram for operating multi-mode oscillation circuity with stepping control.

FIG. 3 illustrates an example sequence flow diagram 300 for operating the multi-mode oscillation circuitry 128 with stepping control, with time elapsing in a downward direction. In the depicted example, the multi-mode oscillation circuitry 128 can be in a first configuration 302 or a second configuration 304 at different times. In the first configuration 302, the oscillator 204-1 is in an active state 306 and the oscillator 204-2 is in the inactive state 308. Additionally, the gain of the oscillator 204-1 is at a first target gain for the first configuration 302. The oscillator 204-1 generates a first amount of phase noise and consumes a first amount of power at the first target gain.

In the second configuration 304, the oscillator 204-1 is in the inactive state 308 and the oscillator 204-2 is in the active state 306. Additionally, the gain of the oscillator 204-2 is at a second target gain for the second configuration 304. The oscillator 204-2 generates a second amount of phase noise and consumes a second amount of power at the second target gain.

Consider, for example, that the first amount of phase noise generated in the first configuration 302 is lower than the second amount of phase noise generated in the second configuration 304. However, the second amount of power consumed in the second configuration 304 is lower than the first amount of power consumed in the first configuration 302. Accordingly, the first configuration 302 results in better phase-noise performance and the second configuration 304 results in reduced power consumption.

At 310, the wireless transceiver 120 is in a second operational mode 312, which has a particular target phase-noise level. As an example, the second operational mode 312 can represent a connected mode for 4G or an idle mode for 5G. In this case, the target phase-noise level for the second operational mode 312 can be realized using the first configuration 302 or the second configuration 304. However, because the second configuration 304 conserves power, the processor 126 causes the multi-mode oscillation circuitry 128 to operate in the second configuration 304.

At 314, the wireless transceiver 120 is in a first operational mode 316, which has a lower target phase-noise level relative to the second operational mode 312. As an example, the first operational mode 316 can represent a connected mode for 5G. In this case, the target phase-noise level for the first operational mode 316 can be realized using the first configuration 302 but not the second configuration 304. As such, the processor 126 causes the multi-mode oscillation circuitry 128 to operate in the first configuration 302 to enable the wireless transceiver 120 to satisfy the target phase-noise level for the first operational mode 316.

At 318, the wireless transceiver 120 is in the second operational mode 312. Accordingly, the processor 126 causes the multi-mode oscillation circuitry 128 to operate in the second configuration 304 to conserve power.

As the wireless transceiver 120 switches between the second operational mode 312 and the first operational mode 316, instead of abruptly switching between the second configuration 304 and the first configuration 302, the step-control circuit 130 causes the multi-mode oscillation circuitry 128 to incrementally transition between the second configuration 304 and the first configuration 302. In particular, the step-control circuit 130 incrementally adjusts the gains of the oscillator 204-1 and the oscillator 204-2 to enable the multi-mode oscillation circuitry 128 to transition between the second configuration 304 and the first configuration 302 without introducing glitching errors or stopping the clock signal 220, as further described with respect to FIGS. 4-1 and 4-2.

Figures 1, 4:
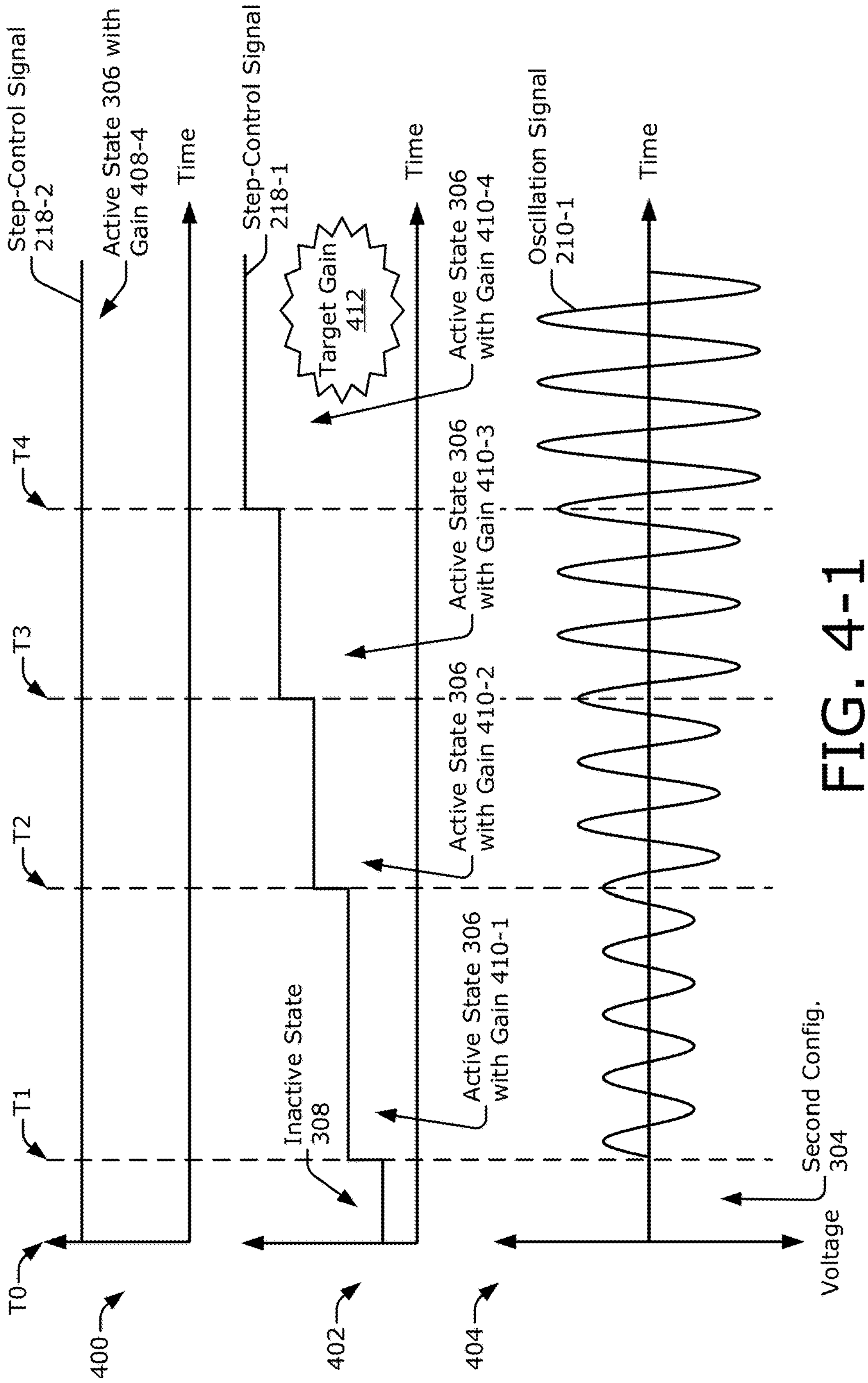
Figures 2, 4:
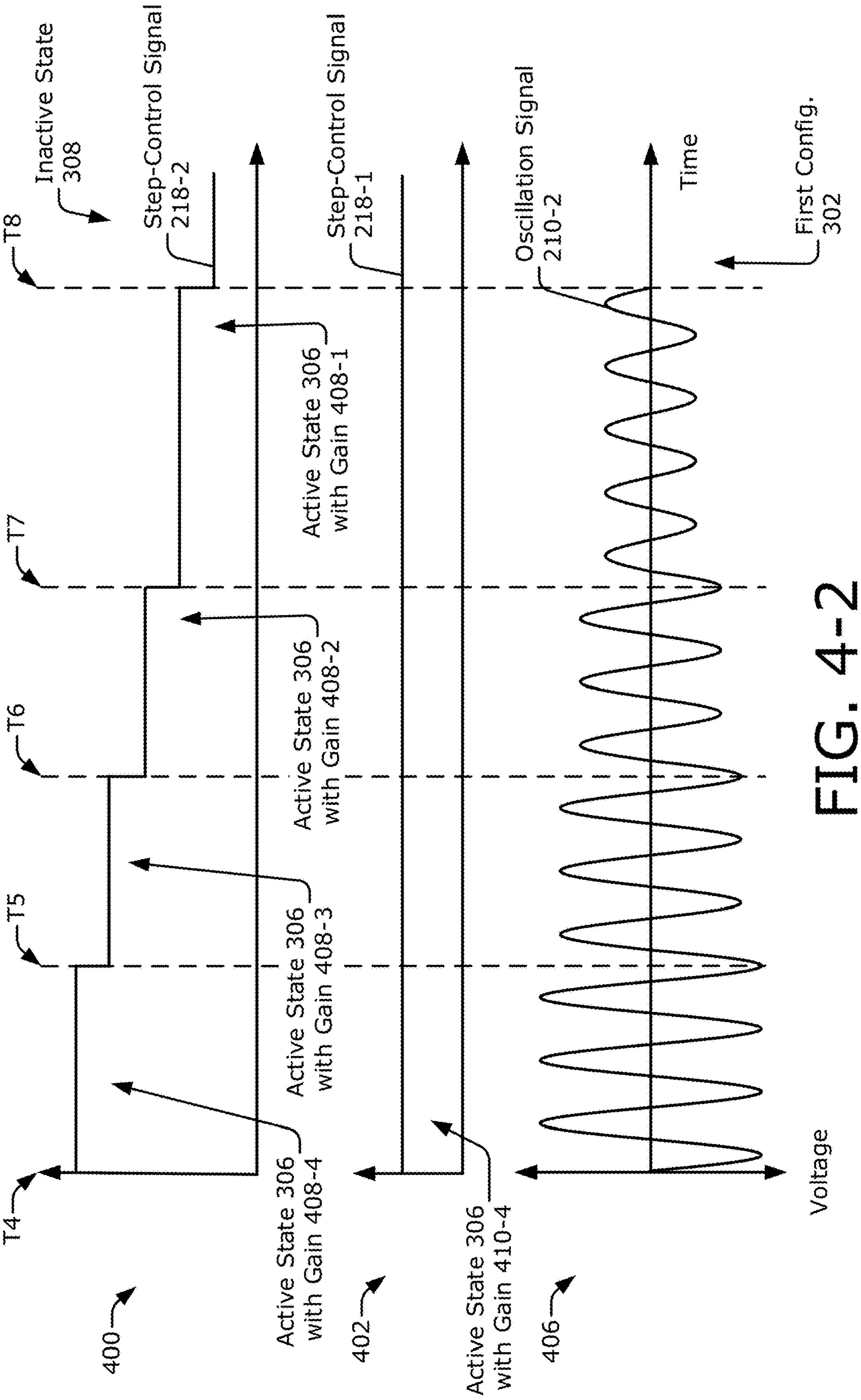

FIGS. 4-1 and 4-2 illustrate example signals for operating the multi-mode oscillation circuitry 128 with stepping control. In particular, the signals shown in FIGS. 4-1 and 4-2 illustrate the incremental transition that occurs from transitioning between operating the multi-mode oscillation circuitry 128 in the second configuration 304 and operating the multi-mode oscillation circuitry 128 in the first configuration 302. Graphs 400, 402, 404, and 406 respectively illustrate variations in the step-control signal 218-2, the step-control signal 218-1, the oscillation signal 210-1, and the oscillation signal 210-2, which can occur during the transition.

In a first example, the multi-mode oscillation circuitry 128 transitions from the second configuration 304 to the first configuration 302, which can occur between 310 and 314 in FIG. 3. A target gain 412 for the first configuration 302 is assumed to be the gain 410-4. However, other operational modes can cause the target gain to be associated with a different gain, such as one of the gains 410-1, 410-2, or 410-3. The oscillators 204-1 and 204-2 can operate in the active state 306 with different gains. For example, the oscillator 204-1 can operate with gains 408-1, 408-2, 408-3, and 408-4, which are ordered from a lowest gain to a highest gain. Additionally, the oscillator 204-2 can operate with gains 410-1, 410-2, 410-3 and 410-4, which are similarly ordered from a lowest gain to a highest gain. The gains 408-1 to 408-4 and the gains 410-1 to 410-4 can represent different gains (e.g., the gains 408-1 to 408-4 are not necessarily equal to the gains 410-1 to 410-4). In this example, the oscillator 204-1 can operate with four different gains 408-1 to 408-4 and the oscillator 204-2 can operate with four different gains 410-1 to 410-4. In other examples, the oscillator 204-1 can operate with a different quantity of gains relative to the oscillator 204-2.

At time T0, the multi-mode oscillation circuitry 128 operates in the second configuration 304. In the graph 400, the step-control signal 218-2 is at a level that causes the oscillator 204-2 to be in the active state 306 and with the gain 408-4. In the graph 402, the step-control signal 218-1 is at a level that causes the oscillator 204-1 to be in the inactive state 308. In the inactive state 308, the oscillator 204-1 does not generate the oscillation signal 210-1, as shown in the graph 404.

At time T1, the multi-mode oscillation circuitry 128 begins to transition to the first configuration 302 as the step driver 216-1 causes the oscillator 204-1 to switch from the inactive state 308 to the active state 306. To do this, the step-control signal 218-1 rises to another level at T1, which causes the oscillator 204-1 to be in the active state 306 with the gain 410-1. Consequently, the oscillator 204-1 generates the oscillation signal 210-1 with a first peak-to-peak voltage, as shown in the graph 404.

From time T2 to time T3 to time T4, the multi-mode oscillation circuitry 128 continues to transition to the first configuration 302 as the step driver 216-1 incrementally increases a gain of the oscillator 204-1 until the target gain 412 is achieved. To do this, the step driver 216-1 incrementally increases the level of the step-control signal 218-1, which causes the gain of the oscillator 204-1 to change in steps (e.g., change from the gain 410-1 to the gain 410-2 to the gain 410-3 to the gain 410-4). By incrementally changing the gain, the oscillator 204-1 incrementally increases the peak-to-peak voltage of the oscillation signal 210-1, as shown in the graph 404. To mitigate glitching errors, the synchronizer 132 causes the level of the step-control signal 218-1 to change at times T2, T3, and T4, which occur near peaks as illustrated in FIG. 4-1 (or valleys in an alternative implementation not illustrated) of the oscillation signal 210-1 and away from zero-crossing points of the oscillation signal 210-1. During this time, the oscillator 204-2 continues to be in the active state 306 with the gain 408-4.

At time T4, the oscillator 204-1 is at the target gain 412 (e.g., the gain 410-4). However, because the oscillator 204-2 is in the active state 306, the multi-mode oscillation circuitry 128 is still in a transition configuration at time T4. In other words, the multi-mode oscillation circuitry 128 is not in the first configuration 302 and not in the second configuration 304 at time T4. To address this, the step-control signal 218-2 is adjusted, as further described with respect to FIG. 4-2.

In FIG. 4-2 from time T5 to time T6 to time T7 to time T8, the multi-mode oscillation circuitry 128 continues to transition to the first configuration 302 as the step driver 216-2 incrementally decreases a gain of the oscillator 204-2 before causing the oscillator 204-2 to switch from the active state 306 to the inactive state 308 at time T8. To do this, the step driver 216-2 incrementally decreases the level of the step-control signal 218-2, which causes the gain of the oscillator 204-2 to change in intervals (e.g., change from the gain 408-4 to the gain 408-3 to the gain 408-2 to the gain 408-1). By incrementally changing the gain, the oscillator 204-2 incrementally decreases the peak-to-peak voltage of the oscillation signal 210-2, as shown in the graph 406. To mitigate glitching errors, the synchronizer 132 causes the level of the step-control signal 218-2 to change at times T5, T6, and T7, which occur near valleys as illustrated in FIG. 4-2 (or peaks in an alternative implementation not illustrated) of the oscillation signal 210-2 and away from zero-crossing points. At time T7, the oscillator 204-2 operates in the active state 306 with the lowest gain (e.g., the gain 408-1). From time T5 to time T7, the oscillator 204-1 continues to be in the active state 306 with the gain 410-4, as shown in the graph 402.

At time T8, the multi-mode oscillation circuitry 128 completes the transition to the first configuration 302 responsive to the step driver 216-2 causing the oscillator 204-2 to switch from the active state 306 to the inactive state 308 at time T8. To do this, the step driver 216-2 decreases the step-control signal 218-2 to another level at T8, which causes the oscillator 204-2 to be in the inactive state 308, as shown in the graph 400. Consequently, the oscillator 204-2 does not generate the oscillation signal 210-2, as shown in the graph 406.

From time T4 to T8 and beyond, the oscillator 204-1 is in the active state 306 and continues to generate the oscillation signal 210-1 with the gain 410-4 shown in the graph 404 at time T4. As the multi-mode oscillation circuitry 128 is in the first configuration 302 at time T8, the resonator 206 generates the clock signal 220 based on the oscillation signal 210-1. This enables the clock signal 220 to satisfy a target phase-noise level for the first operational mode 316 of the wireless transceiver 120, as described above with respect to FIG. 3. If the wireless transceiver 120 switches to the second operational mode 312, the multi-mode oscillation circuitry 128 can transition from the first configuration 302 to the second configuration 304 to conserver power.

Incrementally decreasing the gain of the oscillation signal 210-2, as shown in FIG. 4-2, enables the clock signal 220 to be used reliably by sensitive systems. For other types of systems that are less sensitive, the step driver 216-2 can cause the level of the step-control signal 218-2 to directly change from T4 to T8. This causes the oscillator 204-2 to directly change from operating in the active state 306 with the gain 408-4 at time T4 to the inactive state 308 at time T8, which can decrease a time it takes for the multi-mode oscillation circuitry 128 to transition from the first configuration 302 to the second configuration 304. Additionally, because the oscillator 204-1 is in the active state 306 prior to the oscillator 204-2 switching from the active state 306 to the inactive state 308, this change can occur without stopping the generation of the clock signal 220.

In a second example, the multi-mode oscillation circuitry 128 transitions from the first configuration 302 to the second configuration 304, which can occur between 314 and 318 in FIG. 3. In this case, the operations described above are performed in a reverse order (e.g., performed from time T8 to time T1).

In general, the stepping rate or time period between T2, T3, T4, T5, T6, and T7 can be based on a period of the clock signal 220. As an example, the time period can be several periods of the clock signal 220 (e.g., ten or more periods of the clock signal 220). Additionally, a quantity of incremental steps that occurs can vary based on the target gain 412, which can vary based on the operational mode of the wireless transceiver 120. As an example, the target gain 412 for the first configuration 302 can be the gain 410-2 for a GPS mode. Alternatively, the target gain 412 for the first configuration 302 can be the gain 410-4 for a 5G mode.

In other implementations, the multi-mode oscillation circuitry 128 can include more than two oscillators 204. As such, the multi-mode oscillation circuitry 128 can operate according to more than two configurations (e.g., more than two modes). The techniques described above in regards to transitioning between the first configuration 302 and the second configuration 304 can be similarly applied to transitioning between the first configuration 302 and a third configuration or between the second configuration 304 and the third configuration.

Figure 5:
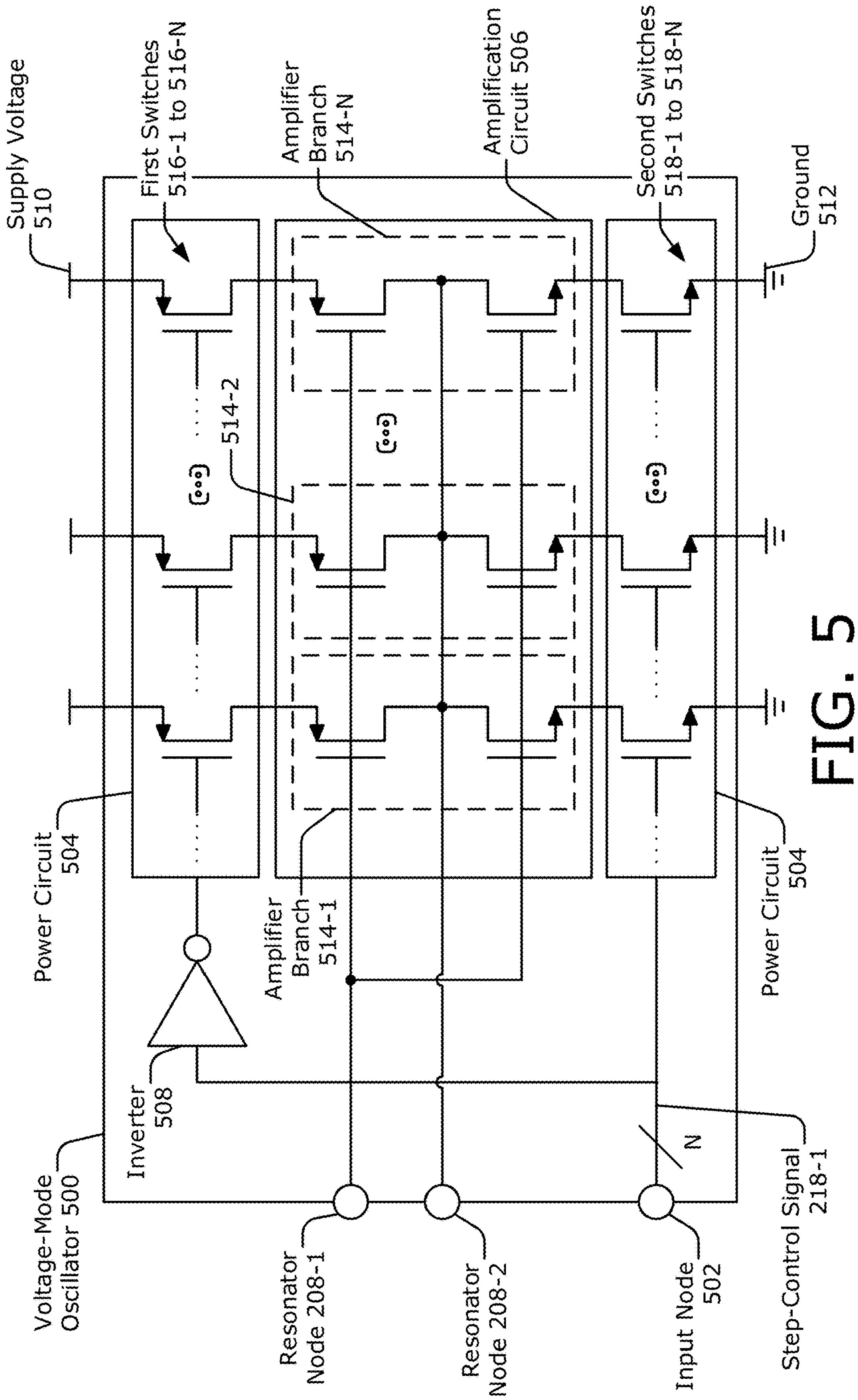
FIG. 5 illustrates an example voltage-mode oscillator for implementing multi-mode oscillation circuitry with stepping control.

FIG. 5 illustrates an example voltage-mode oscillator 500 for implementing the multi-mode oscillation circuitry 128 with stepping control. In some implementations, the voltage-mode oscillator 500 realizes better phase-noise performance relative to a current-mode oscillator. The voltage-mode oscillator 500 includes an input node 502, a power circuit 504, an amplification circuit 506, and an inverter 508. Consider that the voltage-mode oscillator 500 implements the oscillator 204-1. In this case, the input node 502 is coupled to the step driver 216-1.

The power circuit 504 is coupled to the input node 502, a supply voltage 510, a ground 512, and the amplification circuit 506. The power circuit 504 includes a first switches 516-1 to 516-N that are coupled to the supply voltage 510 and the amplification circuit 506, with N representing a positive integer greater than two. In the depicted configuration, the first switches 516-1 to 516-2 are implemented as p-channel metal-oxide-semiconductor field-effect transistors (PMOSFETs). The power circuit 504 also includes second switches 518-1 to 518-N that are coupled to the ground 512 and the amplification circuit 506. The second switches 518-1 to 518-N are shown as n-channel metal-oxide-semiconductor field-effect transistors (NMOSFETs) in FIG. 5.

The amplification circuit 506 can implement a low-noise variable-gain amplifier. The amplification circuit 506 includes multiple amplifier branches 514-1 to 514-N. The amplifier branches 514-1 to 514-N respectively include complementary metal-oxide-semiconductor (CMOS) inverters. Each amplifier branch 514-1 to 514-N is coupled to one of the first switches 516-1 to 516-N and one of the second switches 518-1 to 518-N. Gates of the NMOSFETs and the PMOSFETs within the CMOS inverters are coupled together to the resonator node 208-1. Drains of the NMOSFETs and the PMOSFETs within the CMOS inverters are coupled to the resonator node 208-2.

The step-control signal 218-1 respectively provides N discrete voltages to the second switches 518-1 to 518-N. These discrete voltages are also provided to the inverter 508. The inverter 508 provides inverted versions of the discrete voltages to the respective first switches 516-1 to 516-N. Based on the discrete voltages provided by the step-control signal 218-1, different combinations of amplifier branches 514-1 to 514-N within the amplification circuit 506 can be connected together in parallel between the supply voltage 510 and the ground 512 to realize different gains, such as the gains 410-1 to 410-4 in FIG. 4-1. To cause the voltage-mode oscillator 500 to be in the inactive state 308, the step-control signal 218-1 causes the first switches 516-1 to 516-N to respectively disconnect the amplifier branches 514-1 to 514-N from the supply voltage 510 and the second switches 518-1 to 518-N to respectively disconnect the amplifier branches 514-1 to 514-N from the ground 512.

Figure 6:
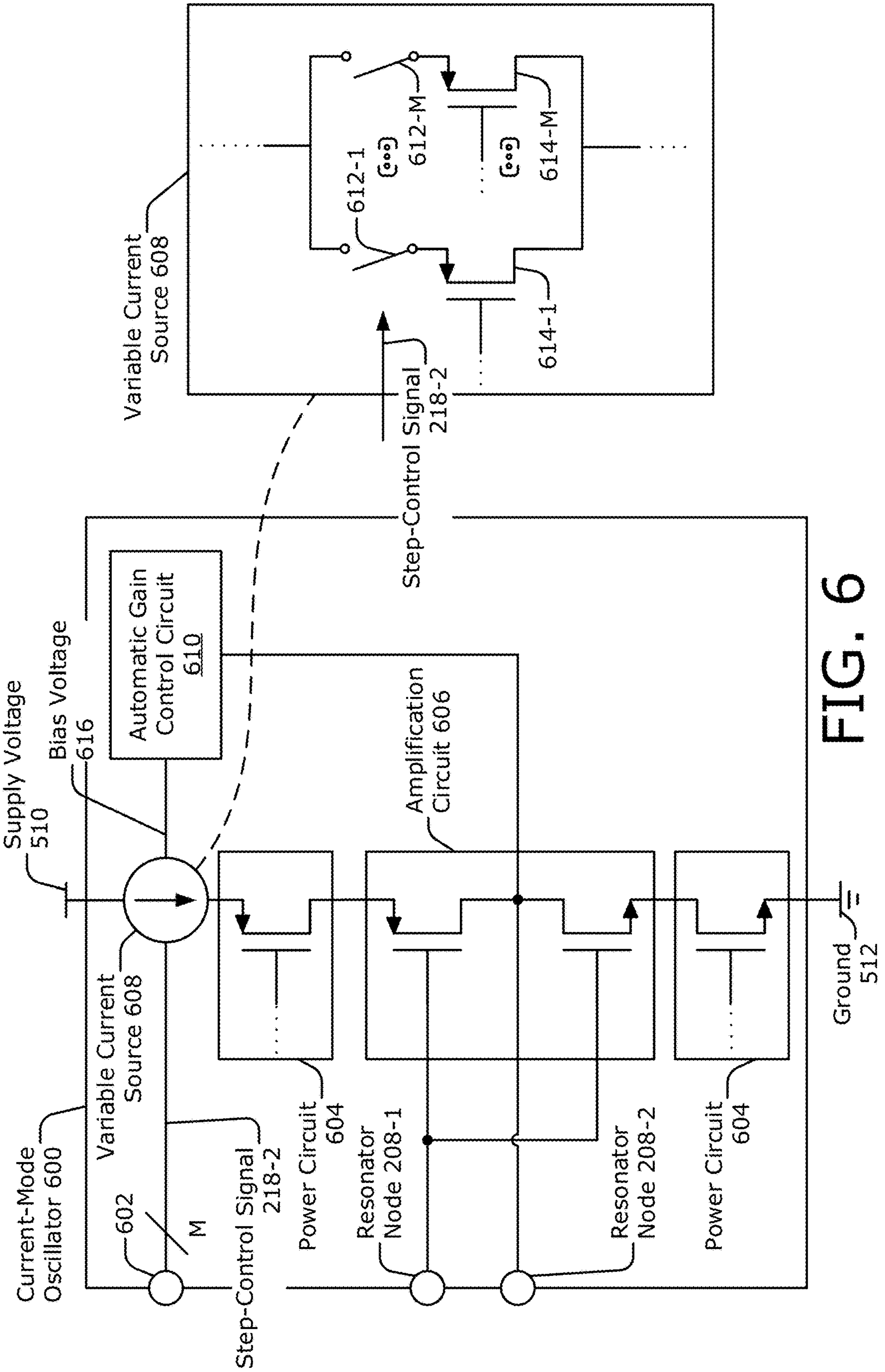
FIG. 6 illustrates an example current-mode oscillator for implementing multi-mode oscillation circuitry with stepping control.

FIG. 6 illustrates an example current-mode oscillator 600 for implementing the multi-mode oscillation circuitry 128 with stepping control. In some implementations, the current-mode oscillator 600 consumes less power relative to the voltage-mode oscillator 500 of FIG. 5. The current-mode oscillator 600 includes an input node 602, a power circuit 604, an amplification circuit 606, a variable current source 608, and an automatic gain control circuit 610. Consider that the current-mode oscillator 600 implements the oscillator 204-2. In this case, the input node 602 is coupled to the step driver 216-2.

The power circuit 604 is coupled to the variable current source 608, the amplification circuit 606, and the ground 512. The power circuit 504 includes a PMOSFET coupled between the variable current source 608 and the amplification circuit 606 and an NMOSFET coupled between the amplification circuit 606 and the ground 512. Gates of the PMOSFET and the NMOSFET are coupled to a voltage generator (not shown), which provides voltages that respectively bias the PMOSFET and the NMOSFET.

The amplification circuit 606 can implement a low-power amplifier. In this example, the amplification circuit 606 includes one CMOS inverter. Gates of the NMOSFET and the PMOSFET within the CMOS inverter are coupled together to the resonator node 208-1. Drains of the NMOSFET and the PMOSFET within the CMOS inverter are coupled to the resonator node 208-2.

The variable current source 608 is coupled to the supply voltage 510, the input node 602, the automatic gain control circuit 610, and the PMOSFET of the power circuit 604. In the depicted example, the variable current source 608 includes pairs of switches 612-1 to 612-M and PMOSFETs 614-1 to 614-M coupled together in parallel between the supply voltage 510 and the source of the PMOSFET of the power circuit 604, with M representing a positive integer greater than two.

The automatic gain control circuit 610 is coupled between the resonator node 208-2 and gates of the PMOSFETs 614-1 to 614-M. The automatic gain control circuit 610 generates a bias voltage 616 based on a voltage at the resonator node 208-2 to bias the PMOSFETs 614-1 to 614-M.

The step-control signal 218-2 provides M discrete voltages to the variable current source 608. These discrete voltages control states of the switches 612-1 to 612-M. Based on the discrete voltages provided by the step-control signal 218-2, different combinations of the PMOSFETs 614-1 to 614-M are connected to the supply voltage 510 to generate a bias current with different amplitudes. The different amplitudes of the bias current enable the current-mode oscillator 600 to realize different gains, such as the gains 408-1 to 408-4 in FIG. 4-2. To cause the current-mode oscillator 600 to be in the inactive state 308, the step-control signal 218-2 causes the variable current source 608 to not generate a bias current.

FIG. 7 is a flow diagram illustrating an example process 700 for operating multi-mode oscillation circuitry with stepping control. The process 700 is described in the form of a set of blocks 702-708 that specify operations that can be performed. However, operations are not necessarily limited to the order shown in FIG. 7 or described herein, for the operations may be implemented in alternative orders or in fully or partially overlapping manners. Also, more, fewer, and/or different operations may be implemented to perform the process 700, or an alternative process. Operations represented by the illustrated blocks of the process 700 may be performed by a clock generator 124 (e.g., of FIG. 1 or 2). More specifically, the operations of the process 700 may be performed by multi-mode oscillation circuitry 128 and a step-control circuit 130 as shown in FIG. 2.

At block 702, a clock signal is generated using a resonator of multi-mode oscillation circuitry. The multi-mode oscillation circuitry comprises a first oscillator and a second oscillator that are coupled to the resonator. For example, the resonator 206 of the multi-mode oscillation circuitry 128 generates the clock signal 220, as shown in FIG. 2. The multi-mode oscillation circuitry 128 comprises the oscillator 204-1 and the oscillator 204-2, which are individually coupled to the resonator 206.

At block 704, the multi-mode oscillation circuitry operates in a first configuration comprising the first oscillator being in an active state and the second oscillator being in an inactive state to enable the resonator to generate the clock signal. For example, the multi-mode oscillation circuitry 128 operates in the first configuration 302, which comprises the oscillator 204-1 being in the active state 306 and the second oscillator 204-2 being in the inactive state 308, as shown at 314 in FIG. 3. The first configuration 302 enables the resonator 206 to generate the clock signal 220.

At block 706, the multi-mode oscillation circuitry operates in a second configuration comprising the first oscillator being in the inactive state and the second oscillator being in the active state to enable the resonator to generate the clock signal. For example, the multi-mode oscillation circuitry 128 operates in the second configuration 304, which comprises the oscillator 204-1 being in the inactive state 308 and the second oscillator 204-2 being in the active state 306, as shown at both 310 and 318 in FIG. 3. The second configuration 304 enables the resonator 206 to generate the clock signal 220.

At block 708, the operating of the multi-mode oscillation circuitry in the second configuration transitions to the operating of the multi-mode oscillation circuitry in the first configuration by incrementally increasing a first gain of the first oscillator while the second oscillator is in the active state. For example, the multi-mode oscillation circuitry 128 transitions from operating according to the second configuration 304 to operating according to the first configuration 302 based on the step-control circuit 130 incrementally increasing the first gain of the first oscillator 204-1 while the second oscillator 204-2 is in the active state 306, as shown in FIG. 4-1.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:

multi-mode oscillation circuitry configured to selectively be in a first configuration or a second configuration, the multi-mode oscillation circuitry comprising:

a resonator;

a first oscillator coupled to the resonator, the first oscillator configured to selectively be in:

an active state based on the first configuration; and an inactive state based on the second configuration; and a second oscillator coupled to the resonator, the second oscillator configured to selectively be in:

the inactive state based on the first configuration; and the active state based on the second configuration; and a step-control circuit coupled to the multi-mode oscillation circuitry, the step-control circuit configured to:

cause the first oscillator to switch from the inactive state to the active state; and incrementally increase a first gain of the first oscillator based on the first oscillator being in the active state to enable the multi-mode oscillation circuitry to transition from the second configuration to the first configuration.

2. The apparatus of claim 1, wherein:

the resonator is coupled between a first resonator node and a second resonator node;

the first oscillator comprises a first amplification circuit coupled to the first resonator node and the second resonator node; and the second oscillator comprises a second amplification circuit coupled to the first resonator node and the second resonator node.

3. The apparatus of claim 1, wherein:

the step-control circuit is configured to incrementally increase the first gain of the first oscillator in two or more steps; and the second oscillator is configured to be in the active state while the step-control circuit incrementally increases the first gain of the first oscillator.

4. The apparatus of claim 1, wherein the step-control circuit is configured to:

incrementally increase the first gain of the first oscillator to a target gain; and cause the second oscillator to switch from the active state to the inactive state responsive to the first gain of the first oscillator being at the target gain.

5. The apparatus of claim 4, wherein:

the step-control circuit is configured to incrementally decrease a second gain of the second oscillator prior to causing the second oscillator to switch from the active state to the inactive state.

6. The apparatus of claim 1, wherein:

the step-control circuit is configured to:

cause the second oscillator to switch from the inactive state to the active state; and incrementally increase a second gain of the second oscillator based on the second oscillator being in the active state to enable the multi-mode oscillation circuitry to transition from the first configuration to the second configuration; and the first oscillator is configured to be in the active state while the step-control circuit incrementally increases the second gain of the second oscillator.

7. The apparatus of claim 6, wherein:

the first oscillator is configured to generate a first oscillation signal responsive to being in the active state;

the step-control circuit is configured to incrementally increase a first peak-to-peak voltage of the first oscillation signal to enable the multi-mode oscillation circuitry to transition from the second configuration to the first configuration;

the second oscillator is configured to generate a second oscillation signal responsive to being in the active state; and the step-control circuit is configured to incrementally increase a second peak-to-peak voltage of the second oscillation signal to enable the multi-mode oscillation circuitry to transition from the first configuration to the second configuration.

8. The apparatus of claim 7, wherein the resonator is configured to selectively:

generate a clock signal based on the first oscillation signal;

generate the clock signal based on the second oscillation signal; or generate the clock signal based on both the first oscillation signal and the second oscillation signal.

9. The apparatus of claim 6, wherein:

the first oscillator comprises a voltage-mode oscillator; and the second oscillator comprises a current-mode oscillator.

10. The apparatus of claim 9, wherein:

the voltage-mode oscillator comprises:

an amplification circuit comprising multiple amplifier branches; and a power circuit coupled to the amplification circuit, the power circuit comprising:

first switches respectively coupled between the multiple amplifier branches and a supply voltage; and second switches respectively coupled between the multiple amplifier branches and a ground, the power circuit configured to connect different quantities of the multiple amplifier branches together in parallel via the first switches and the second switches; and the step-control circuit is configured to generate a step-control signal that incrementally increases a quantity of the multiple amplifier branches that are connected together in parallel via the power circuit to incrementally increase the first gain of the voltage-mode oscillator.

11. The apparatus of claim 9, wherein:
the current-mode oscillator comprises:
a variable current source configured to generate a bias current; and
an amplification circuit coupled to the variable current source; and
the step-control circuit is configured to generate a step-control signal that incrementally increases an amplitude of the bias current to incrementally increase the second gain of the current-mode oscillator.

12. The apparatus of claim 1, further comprising:
a wireless transceiver; and
a clock generator comprising an output node, the multi-mode oscillation circuitry, and the step-control circuit, the output node coupled to the wireless transceiver, the clock generator configured to generate a clock signal at the output node.

13. The apparatus of claim 12, wherein:
the wireless transceiver is configured to selectively operate in a first operational mode or a second operational mode, the first operational mode having a first target phase-noise level that is lower than a second target phase-noise level of the second operational mode;
the first oscillator is configured to consume a first amount of power to generate a first oscillation signal having a first amount of phase noise;
the second oscillator is configured to consume a second amount of power to generate a second oscillation signal having a second amount of phase noise, the second amount of phase noise being greater than the first amount of phase noise, the second amount of power being lower than the first amount of power;
the resonator is configured to selectively:
generate the clock signal based on the first oscillation signal; or
generate the clock signal based on the second oscillation signal; and
the multi-mode oscillation circuitry is configured to selectively be in:
the first configuration based on the first operational mode; or
the second configuration based on the second operational mode.

14. The apparatus of claim 12, further comprising:
a display screen; and
a processor operably coupled to the display screen and the wireless transceiver, the processor configured to present one or more graphical images on the display screen based on signals communicated by the wireless transceiver using the clock signal.

15. The apparatus of claim 12, wherein:
the clock generator further comprises a synchronizer coupled between the output node and the step-control circuit, the synchronizer configured to:
generate a timing signal that causes the step-control circuit to increase the first gain of the first oscillator at a time that occurs between two zero-crossings of the clock signal, the time associated with a peak or a valley of the clock signal.

16. The apparatus of claim 1, wherein the resonator is coupled between a first resonator node and a second resonator node, wherein the multi-mode oscillation circuitry is configured to generate at the first resonator node a signal other than a differential component of a signal at the second resonator node.

17. An apparatus comprising:
multi-mode oscillation circuitry configured to selectively be in a first configuration or a second configuration, the multi-mode oscillation circuitry comprising:
a resonator;
a first oscillator coupled to the resonator, the first oscillator configured to selectively be in:
an active state based on the first configuration; and
an inactive state based on the second configuration; and
a second oscillator coupled to the resonator, the second oscillator configured to selectively be in:
the inactive state based on the first configuration; and
the active state based on the second configuration; and
stepping means for causing the first oscillator to switch from the inactive state to the active state and incrementally increasing a first gain of the first oscillator to enable the multi-mode oscillation circuitry to transition from the second configuration to the first configuration.

18. The apparatus of claim 17, wherein:
the stepping means is configured to incrementally increase the first gain of the first oscillator in two or more steps; and
the second oscillator is configured to be in the active state while the stepping means incrementally increases the first gain of the first oscillator.

19. The apparatus of claim 17, wherein the stepping means is configured to:
incrementally increase the first gain of the first oscillator to a target gain; and
cause the second oscillator to switch from the active state to the inactive state responsive to the first gain of the first oscillator being at the target gain.

20. The apparatus of claim 19, wherein:
the stepping means is configured to incrementally decrease a second gain of the second oscillator prior to causing the second oscillator to switch from the active state to the inactive state.

21. The apparatus of claim 17, wherein:
the stepping means comprises digital means for generating a step-control signal that controls the first gain of the first oscillator.

22. The apparatus of claim 21, wherein:
the first oscillator comprises:
an amplification circuit comprising multiple amplifier branches;
a power circuit coupled to the amplification circuit, the power circuit comprising:
first switches respectively coupled between the multiple amplifier branches and a supply voltage; and
second switches respectively coupled between the multiple amplifier branches and a ground,
the power circuit configured to connect different quantities of the multiple amplifier branches together in parallel via the first switches and the second switches;
the step-control signal comprises discrete voltages that respectively control states of the first switches and the second switches; and
the digital means is configured to incrementally increase a quantity of the multiple amplifier branches that are connected together in parallel via the step-control signal to incrementally increase the first gain of the first oscillator.

23. The apparatus of claim 21, wherein:

the first oscillator comprises:

a variable current source configured to generate a bias current; and an amplification circuit coupled to the variable current source;

the step-control circuit controls an amplitude of the bias current; and the digital means is configured to incrementally increase the amplitude of the bias current via the step-control signal to incrementally increase the first gain of the first oscillator.

24. A method for operating multi-mode oscillation circuitry with stepping control, the method comprising:

generating a clock signal using a resonator of the multi-mode oscillation circuitry, the multi-mode oscillation circuitry comprising a first oscillator and a second oscillator that are coupled to the resonator;

operating the multi-mode oscillation circuitry in a first configuration comprising the first oscillator being in an active state and the second oscillator being in an inactive state to enable the resonator to generate the clock signal;

operating the multi-mode oscillation circuitry in a second configuration comprising the first oscillator being in the inactive state and the second oscillator being in the active state to enable the resonator to generate the clock signal; and transitioning from the operating of the multi-mode oscillation circuitry in the second configuration to the operating of the multi-mode oscillation circuitry in the first configuration by incrementally increasing a first gain of the first oscillator while the second oscillator is in the active state.

25. The method of claim 24, wherein:

the transitioning from the operating of the multi-mode oscillation circuitry in the second configuration to the operating of the multi-mode oscillation circuitry in the first configuration comprises:

incrementally increasing the first gain of the first oscillator in two four or more steps to a target gain; and causing the second oscillator to switch from the active state to the inactive state responsive to the first gain of the first oscillator being at the target gain.

26. The method of claim 25, wherein:

the transitioning from the operating of the multi-mode oscillation circuitry in the second configuration to the operating of the multi-mode oscillation circuitry in the first configuration comprises:

incrementally decreasing a second gain of the second oscillator prior to causing the second oscillator to switch from the active state to the inactive state; and the method further comprises transitioning from the operating of the multi-mode oscillation circuitry in the first configuration to the operating of the multi-mode oscillation circuitry in the second configuration by incrementally increasing a second gain of the second oscillator.

27. The method of claim 24, wherein:

the operating of the multi-mode oscillation circuitry in the first configuration comprises:

generating a first oscillation signal via the first oscillator; and generating the clock signal based on the first oscillation signal;

the operating of the multi-mode oscillation circuitry in the second configuration comprises:

generating a second oscillation signal via the second oscillator; and generating the clock signal based on the second oscillation signal; and the transitioning from the operating of the multi-mode oscillation circuitry in the second configuration to the operating of the multi-mode oscillation circuitry in the first configuration comprises:

generating the first oscillation signal via the first oscillator;

generating the second oscillation signal via the second oscillator; and generating the clock signal based on both the first oscillation signal and the second oscillation signal.

28. An apparatus comprising:

a clock generator comprising:

multi-mode oscillation circuitry comprising:

a resonator;

a first oscillator coupled to the resonator, the first oscillator configured to selectively be in an active state or an inactive state; and a second oscillator coupled to the resonator, the second oscillator configured to selectively be in the active state or the inactive state; and a step-control circuit comprising:

a first step driver coupled to the first oscillator and configured to incrementally adjust a first gain of the first oscillator while the second oscillator is in the active state; and a second step driver coupled to the second oscillator and configured to incrementally adjust a second gain of the second oscillator while the first oscillator is in the active state.

29. The apparatus of claim 28, wherein the clock generator comprises a synchronizer coupled between the multi-mode oscillation circuitry and the step-control circuit, the synchronizer configured to control times at which the first step driver adjusts the first gain and the second step driver adjusts the second gain.

30. The apparatus of claim 28, wherein:

the first oscillator comprises a voltage-mode oscillator; and the second oscillator comprises a current-mode oscillator.

* * * * *